(12) United States Patent
He

(10) Patent No.: US 8,175,565 B1
(45) Date of Patent: *May 8, 2012

(54) IMAGE REJECTION SCHEME FOR RECEIVERS

(75) Inventor: Runsheng He, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 679 days.

This patent is subject to a terminal disclaimer.

(21) Appl. No.: 12/273,051

(22) Filed: Nov. 18, 2008

Related U.S. Application Data

(63) Continuation of application No. 10/891,672, filed on Jul. 15, 2004, now Pat. No. 7,522,899.

(51) Int. Cl.
*H04B 1/16* (2006.01)

(52) U.S. Cl. ....................................................... 455/302

(58) Field of Classification Search .................. 455/296, 455/302, 303, 304, 305, 307, 313, 323, 326, 455/333, 340
See application file for complete search history.

(56) References Cited

U.S. PATENT DOCUMENTS

| | | | |
|---|---|---|---|
| 3,681,697 A | 8/1972 | Moroney | |
| 4,955,079 A | 9/1990 | Connerney et al. | |
| 2002/0090924 A1 * | 7/2002 | Suominen | 455/302 |
| 2005/0159129 A1 * | 7/2005 | Iida | 455/326 |

* cited by examiner

*Primary Examiner* — Thanh Le

(57) ABSTRACT

An RF receiver image rejection scheme. The RF is received and mixed in two quadrature channels allowing separation of the undesired image portion within the RF signal from the desired portion. The two channels can be summed to allow the image portions to cancel out and form a signal which is predominantly based on the desired portion. Another sum of the two channels can also be made to provide a signal which is primarily based on the image portion. Since there are some components of the image portion even in the compensated desired signal, that signal indicative of the image portion is used to compensate for that undesired portion.

46 Claims, 9 Drawing Sheets a lowered frequency $f_{LO}$. This lower frequency allows the

IMAGE REJECTION SCHEME FOR RECEIVERS

CROSS REFERENCE TO RELATED APPLICATIONS

This application is a continuation application of U.S. patent application Ser. No. 10/891,672, filed Jul. 15, 2004. The entire disclosure of U.S. patent application Ser. No. 10/891,672 is incorporated herein by reference.

BACKGROUND

Reception of a low level RF signal often benefits from low noise and high precision operation. Noise and imprecision in such circuits has many different origins.

One common undesired signal is called an image frequency. The image signal is symmetrical to the desired frequency, relative to the local oscillator frequency.

The undesired component of the image frequency may cause image frequency interference, and this may produce undesirable content in the eventual received signal. Image frequency interference may reduce the amount of information that the channel can carry.

Different techniques have been used to reduce the effect of the image frequency interference.

SUMMARY

The present system teaches a new technique for reducing the effect of image frequency interference. One aspect defines a digital filter for a receiver. The filter can be digital or analog. The filter operates to form a first signal that mostly indicates the desired signal, and a second signal that mostly indicates the image signal, and uses the second signal to compensate the first signal.

A specific aspect describes a mixer, that has an in-phase mixer branch, forming an in-phase version of a complex signal, and a quadrature mixer branch maintaining a quadrature version of the same said complex signal, one of said branches including a phase rotator which rotates a first portion of said signal to relative to a second portion of said signal, wherein one of said first and second portions represents a desired portion of the signal and the other of said first and second portions represents an image portion of the signal; and first and second adders, where the first adder obtains a difference between said in-phase and quadrature signals to obtain a first signal which is primarily based on said first portion, and the second adder obtains a sum between said in-phase and quadrature signals to obtain a second signal which is primarily based on the second portion. A compensation part which uses one of said first and second signals to compensate the other of said first and second signals.

BRIEF DESCRIPTION OF THE DRAWINGS

These and other aspects will now be described in detail with reference to the accompanying drawings, wherein.

DETAILED DESCRIPTION

A number of different receiver topologies may be used to reduce the effect of the image signal.

Figure 1:
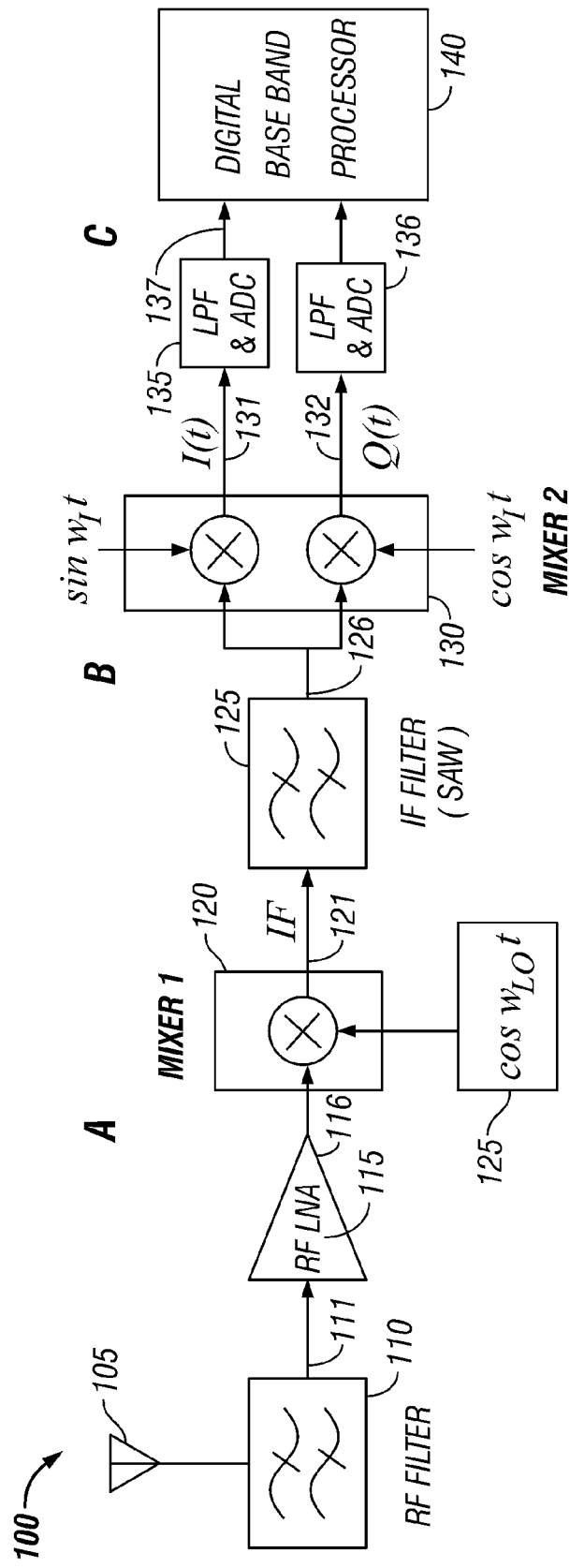
FIG. 1 shows a block diagram of a typical superheterodyne receiver using quadrature mixing.

FIG. 1 shows a block diagram of a first receiver. An RF signal 100 is received by an antenna 105. The signal is filtered by an RF filter 110, which may be, for example, a filter which allows the desired channel to pass. The filtered signal 111 is amplified by a low noise amplifier 115. The amplified signal 116 is then mixed in a mixer 120 with a local oscillator frequency from source 125. The output 121 of the mixer is applied to an IF filter 125 which may be a surface acoustic wave "SAW" device. The output 126 of the SAW filter is then mixed with sine and cosine components, to form in-phase 131 and quadrature 132 signals, in a second mixer 130. Each of the in-phase 131 and quadrature 132 signals are low pass filtered and converted to digital by respective LPF and ADC blocks 135, 136. The resultant signals are digital baseband signals 137. These signals are processed by a digital baseband processor 140.

Figure 2A:
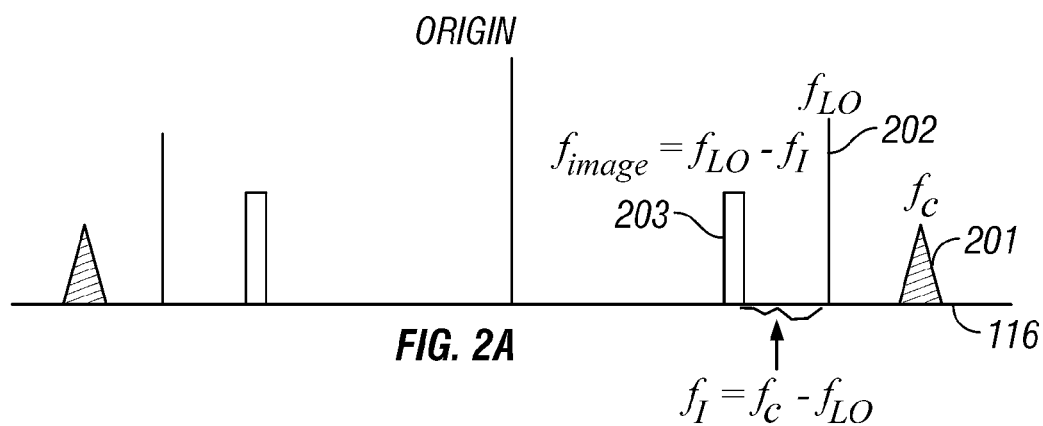
FIGS. 2A-2C show exemplary frequency domain transformations which occur in the FIG. 1 device.
Figure 2B:
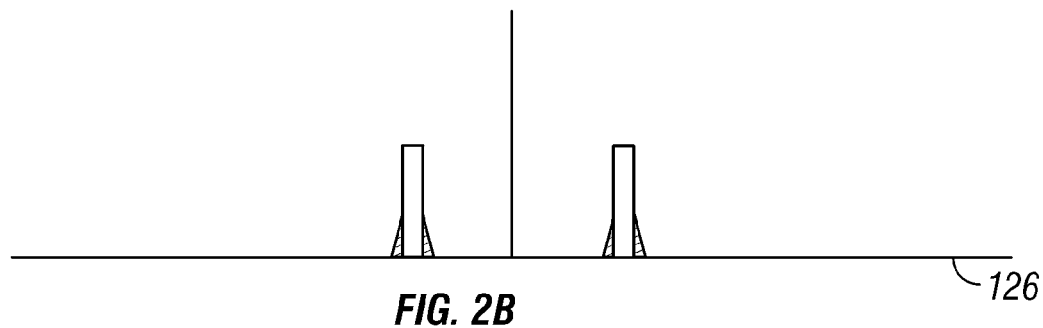
Figure 2C:
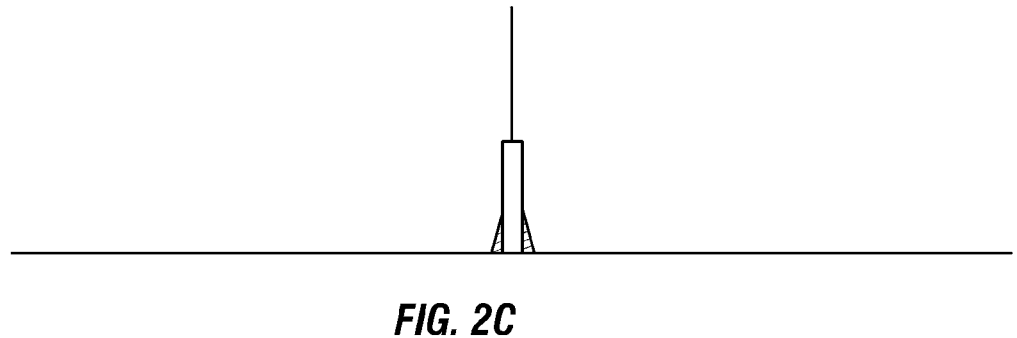

An exemplary frequency domain version of the signals is shown in FIGS. 2A-2C.

FIG. 2A shows the output 116 of the low noise amplifier 115. This includes both a desired signal $f_c$(signal 201) and its mirror image signal $f_{image}$(signal 203), which is symmetrical to $f_c$ relative to the local oscillator frequency $f_{LO}$(signal 202).

FIG. 2B shows how the output signal 126 from IF filter includes a combination of the desired signal $f_c$, and the image signal $f_{image}$.

FIG. 2C shows the resultant baseband-converted output signal 137, showing that this is a combination of the desired signal $f_c$ and the image signal $f_{image}$. It may be desirable to reject the image frequency to eliminate the image component from the final signal. A low pass filter may also be used to filter out adjacent channel components in FIG. 2A.

Figure 3:
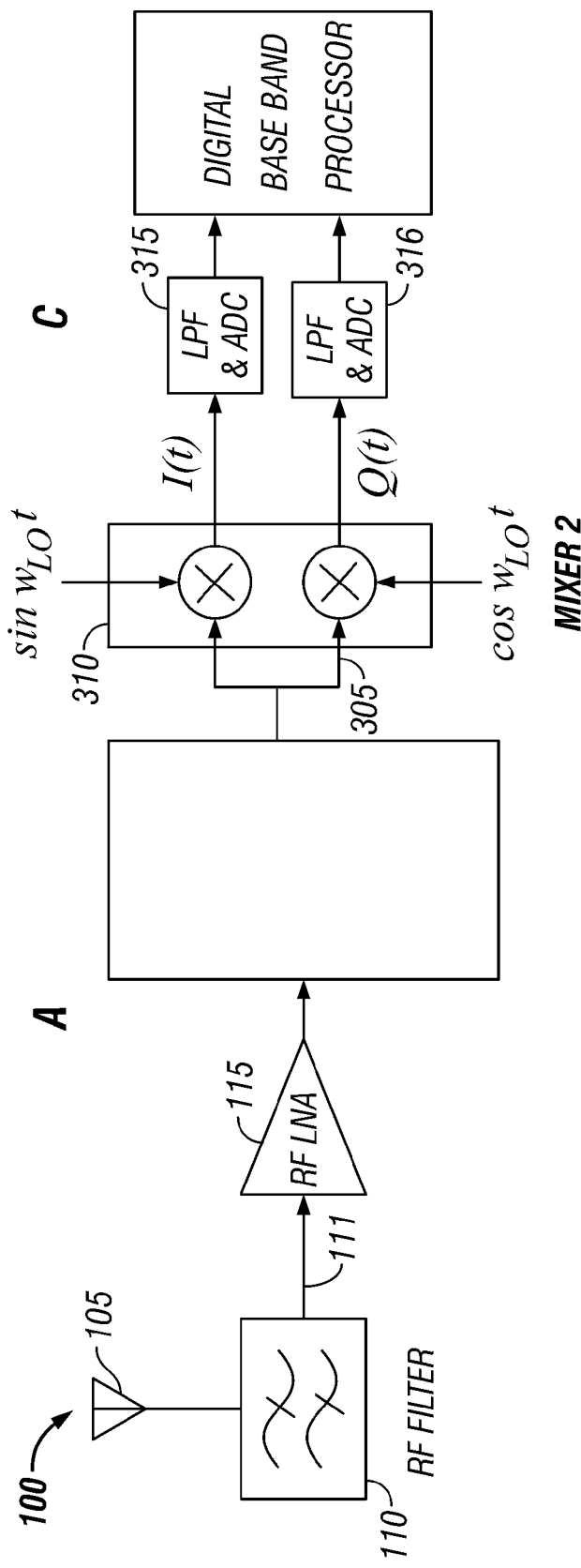
FIG. 3 shows a block diagram of a direct conversion receiver.

In certain receivers, it may be desirable to carry out more of the processing in digital, to provide the advantages of digital electronics including improved noise rejection. A block diagram of a direct conversion receiver is shown in FIG. 3. This includes the LNA 115 as in FIG. 1, but no IF stages. Instead the RF signal output 305 of the LNA is directly converted to in-phase and quadrature signals in mixer 310. These in phase and quadrature signals are each applied to respective filter and A/D converter blocks 315, 316, and are directly filtered and converted from analog to digital. No SAW filter is used in this circuit. Also, since there is no IF, no image signal is formed.

Figure 4:
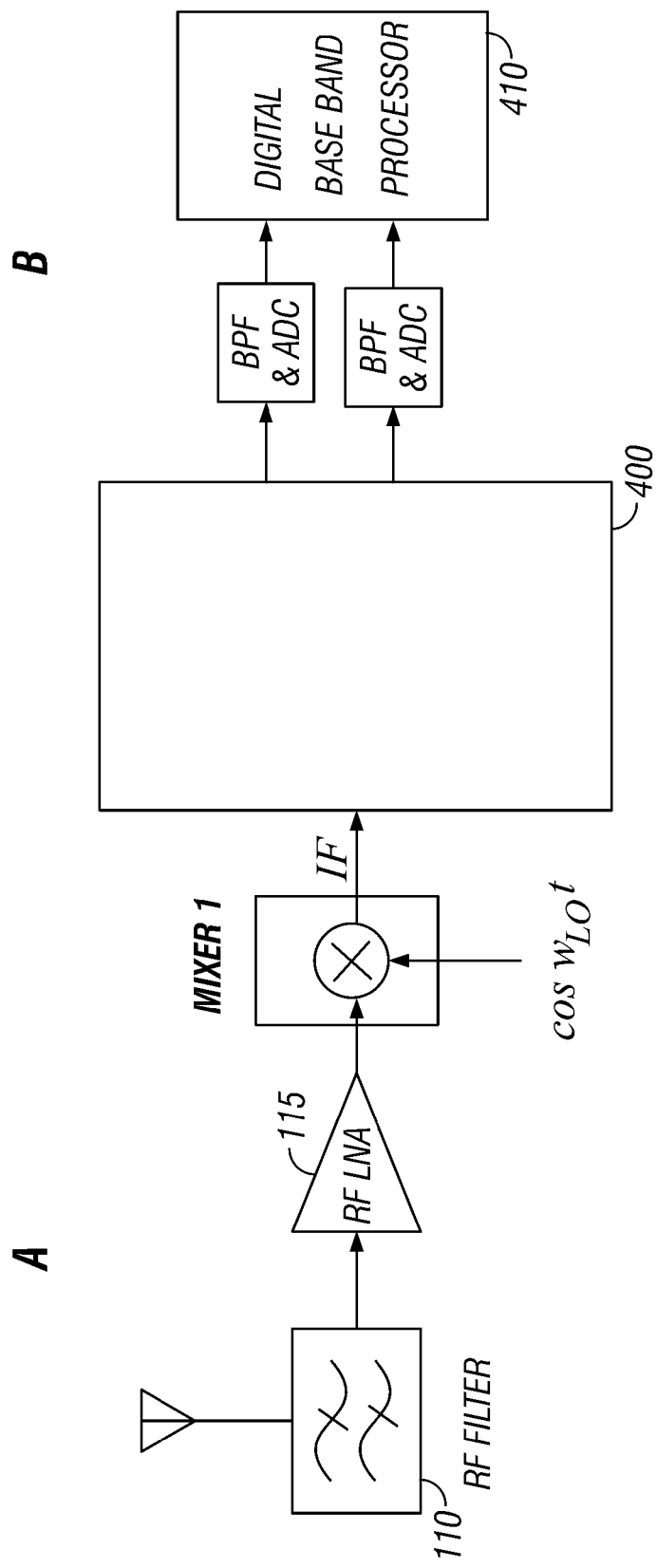
FIG. 4 shows a block diagram of a low IF conversion receiver.

Circuit related low frequency noise and offsets exist in the direct conversion signal, e.g., based on noise and nonlinearities and/or by RF leakage added by the circuit components. Because the signal remains at relatively low frequency, it may be very difficult to distinguish the low frequency noise from the desired signal itself FIG. 4 shows an alternative system in which low IF conversion is used. The low IF converter 400 may use similar circuitry to that described in FIG. 1, but uses signal to be digitized directly after the IF stage. The function of the second mixer is therefore done within the baseband processor 410, in the digital domain. Since this system uses a signal spectrum that does not overlap the low frequency noise, the low frequency noise can be separated from the remaining parts of the signal, using a filter.

The IF frequency $f_I$ needs to be sufficiently low that an A/D converter can be used to digitize the IF signal. As an example, for a 2.4 GHz channel, a typical IF signal would be in range of hundreds of megahertz. A low IF signal, in contrast, would be around 40 MHz, hence reduced by approximately a decade. While this circuit allows certain processing to be done in the digital domain, the image frequency $f_{image}$ will be close to the local oscillator frequency and to the desired frequency. The value $f_I$ in FIG. 2A, representing the spacing between $f_{LO}$ and $f_{image}$, gets smaller. As $f_I$ gets small, it becomes more difficult to filter the image frequency from the desired frequency.

Figure 5:
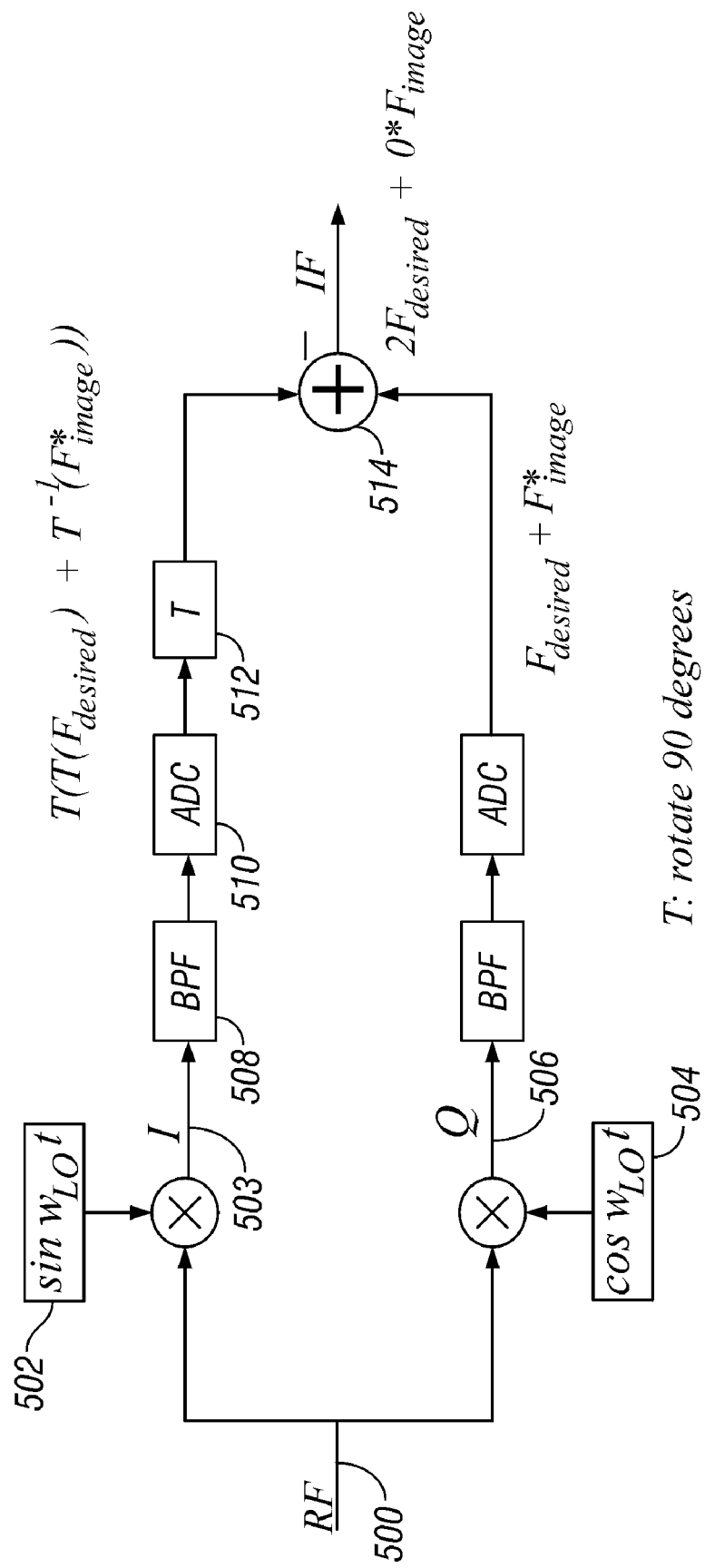
FIG. 5 shows a block diagram of an image rejection quadrature mixer.

An image rejection mixer may be used to reduce the image signal using a complex signal representation to distinguish the image signal component from the desired signal component. An image rejection mixer is shown in FIG. 5. The input RF shown as 500 is mixed with an in-phase mixing signal 502 to form an in-phase branch, and mixed with a quadrature signal 504 to form a quadrature branch 506. Each of the branches are then filtered by a bandpass filter 508 and digitized by an A/D converter 510. The quadrature branch is also rotated by 90° by a phase rotation element T, element 512. The phase rotation element can be a hardware device, which causes a 90 degree phase clockwise inversion. This forms two branches, where the first branch has an output signal $$T(T(F_{desired})+T^{-1}(F^*_{image}))$$

where T represents a 90° clockwise rotation, $$=-F_{desired}F^*_{image}$$

Where $F^*_{image}$ represents the conjugate of the signal, and the second branch has a signal $$F_{desired}+F^*_{image}$$

The two branches are digitally summed at 514 to produce an "IF signal" that includes summed desired frequencies from both branches and cancelled image frequencies from both branches.

$$IF=2F_{desired}+O^*F_{image} \quad (1)$$

Ideally, this system will reject the entire image signal ($F_{image}$). However, imperfections in the mixers, the rotator and the channels, will cause distortion. Magnitude and phase mismatches between the I and Q mixers will cause the I and Q channels to have slightly different signal handling characteristics, leading to distortion and crosstalk. Therefore, while equation (1) represents the output for a perfect channel, the actual IF output signal can be expressed as $$IF:\hat{F}_{desired}=W_{distort}*F_{desired}+W_{cross}*F_{image}$$

Where $F\hat{}$ represents the actual value of $F_{desired}$. Defining this in terms of inverse of channel distortion (a number close to 1) gives $$IF:W_{distort}^{-1}*\hat{F}_{desired}=F_{desired}+W_{distort}^{-1}*W_{cross}*F_{image}$$

Compensating for mismatch between the mixers can improve the performance. However, it is often not practical to remove all mismatch between the I and Q channels. Rejection of 20-30 db is typical.

Figure 6A:
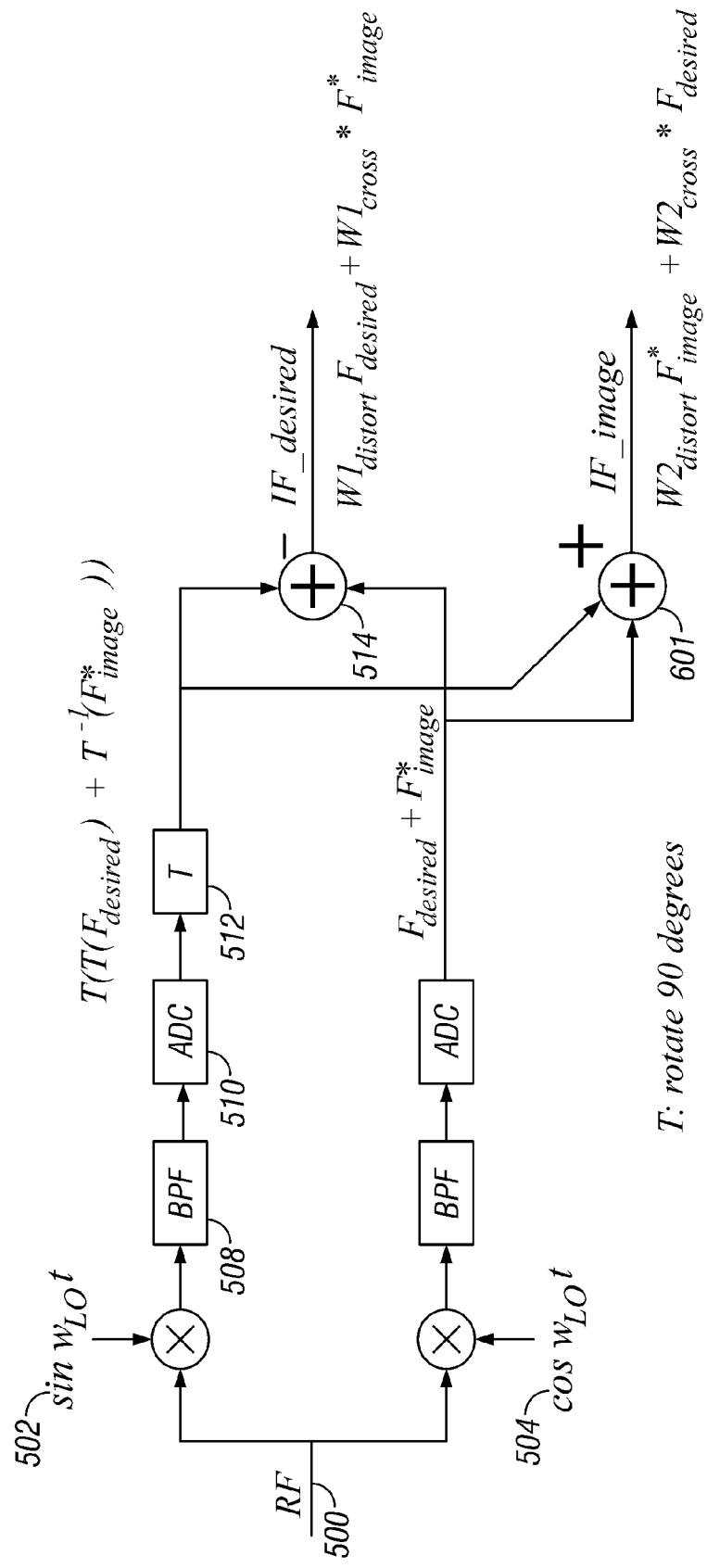
FIG. 6A shows a block diagram of an improved image rejection mixer with additional compensation signals.

FIG. 6A shows an alternative image rejection filter which can reduce errors caused by distortion and crosstalk. The filter in FIG. 5 subtracts signals to form a signal that is primarily the desired signal, but has image components also, in amounts based on imperfections in the circuit. In FIG. 6, an additional adder 601 adds the I and Q signals. The output of the adder is an additive signal, which is primarily image signal, but also includes components of the desired signal, in amounts based on circuit imperfections.

The output from the first summer 514 (I-Q) is the signal, as above $$IF_{desired}=W1_{distort}F_{desired}+W1_{cross}*F^*_{image} \quad (3)$$

where $W1_{cross} \rightarrow 0$, and $W1_{distort} \rightarrow 1$. Hence, $IF_{desired}$ represents mostly the desired signal.

The additional IF image signal from adder 601 is called $IF_{image}$, and corresponds to the signal $$\hat{F}_{image}=IF_{image}=W2_{distort}F^*_{image}+W2_{cross}*F_{desired} \quad (4)$$

where $W2_{distort} \rightarrow 1$ and $W2_{cross} \rightarrow 0$. This signal is mostly dominated by the image component. $W1_{distort}$; $W1_{cross}$, $W2_{distort}$ and $W2_{cross}$ can be estimated, or adaptively or otherwise determined. The value of $IF_{image}$ from equation (4) is then used, along with values of at least W1, in equation (3) to solve for a compensated version of IF desired, as:

$$IF_{desired}=\hat{F}_{desired} \approx IF_{desired} - \frac{W1_{cross}}{W2_{distort}}*IF_{image}$$

This compensated signal removes more of the undesired components.

Figure 6B:
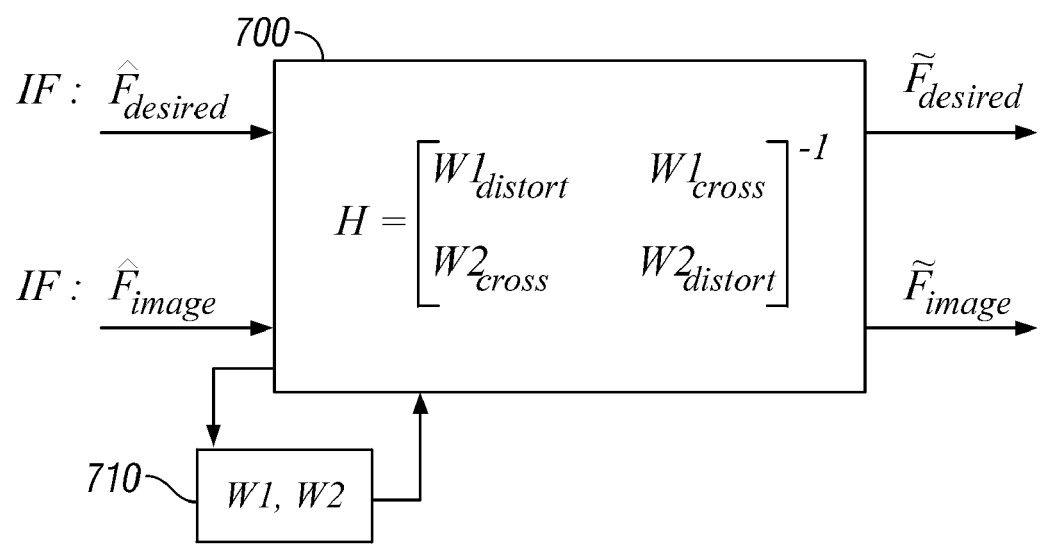
FIG. 6B shows a digital filter which can carry out the function of the improved image rejection mixer in FIG. 6A.

FIG. 6B shows this operation being done in the digital domain using an inverse matrix filter, having the transfer function:

$$H = \begin{bmatrix} W1_{distort} & W1_{cross} \\ W2_{cross} & W2_{distort} \end{bmatrix}^{-1}$$

A channel characteristic storage device 710 may be used to determine characteristics of the channel. The uncompensated values $F_{desired}$ and $F_{image}$ are input to the filter, and the transformation is used to $\hat{F}_{desired}$ estimate and $\hat{F}_{image}$ using equations (3) and (4), and channel characteristics.

The characteristics of the channel can be found using any of a number of different techniques. A first open loop technique can be used in which the characteristics of the channel are found e.g. by calibration, and stored into the channel characteristic storage device 710.

A different open loop technique can store a table with a number of different W1 and W2 values, and select the best set of W1, W2 values on power up.

Figure 8:
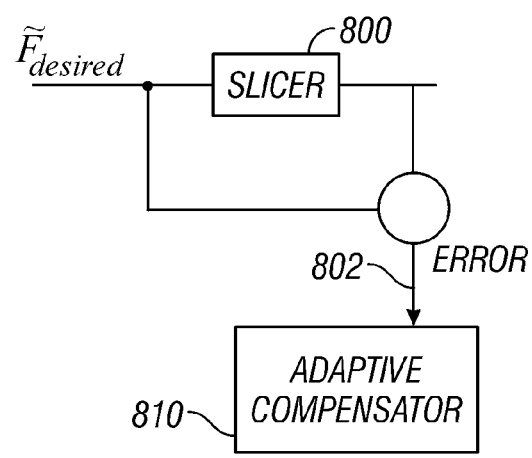
FIG. 8 shows a block diagram of an exemplary adaptive compensation device.

Alternatively, an adaptive compensation scheme can be used as shown with reference to FIG. 8. FIG. 8 shows the desired frequency being input to a slicer 800 which is a two-dimensional slicer that determines an error signal 802 between the actual signal received, and a decision made about the signal. The error signal 802 is fed back as part of the desired frequency, and also input to an adaptive compensator 810. The adaptive compensator uses a least mean squares approach to determine the channel characteristics from the calculated values.

The signals are taken as corresponding with the signals as follows:

$$\tilde{F}_{desired} = [H11 \ H12] * \begin{bmatrix} \hat{F}_{desired} \\ \hat{F}_{image} \end{bmatrix}$$

$$\begin{bmatrix} H11(k+1) \\ H12(k+1) \end{bmatrix} = \begin{bmatrix} H11(k) \\ H12(k) \end{bmatrix} - \mu \times e(k) \times \begin{bmatrix} \hat{F}^*_{desired}(k) \\ \hat{F}^*_{image}(k) \end{bmatrix}$$

where "*" denotes conjugate
e(k) is the estimated error which is $$e(k) = \tilde{F}_{desired} - (\text{decision on } \tilde{F}_{desired})$$

and feeds the error signal into that equation to find the channel characteristics.

In the equation above, H(k+1) is the adaptive compensation values for a current time, H(k) is the adaptive compensation values for a previous time, e(k) is the error signal in that previous time, $\mu$ is a scaling factor used to prevent overcompensation during any specific time interval, and is the actual received values for that previous time. The adaptive compensation scheme therefore adaptively determines the channel values and allows them to settle towards the proper values at each specific time.

No matter how determined, characteristics of the channel which are stored in the store 710.

Figure 7A:
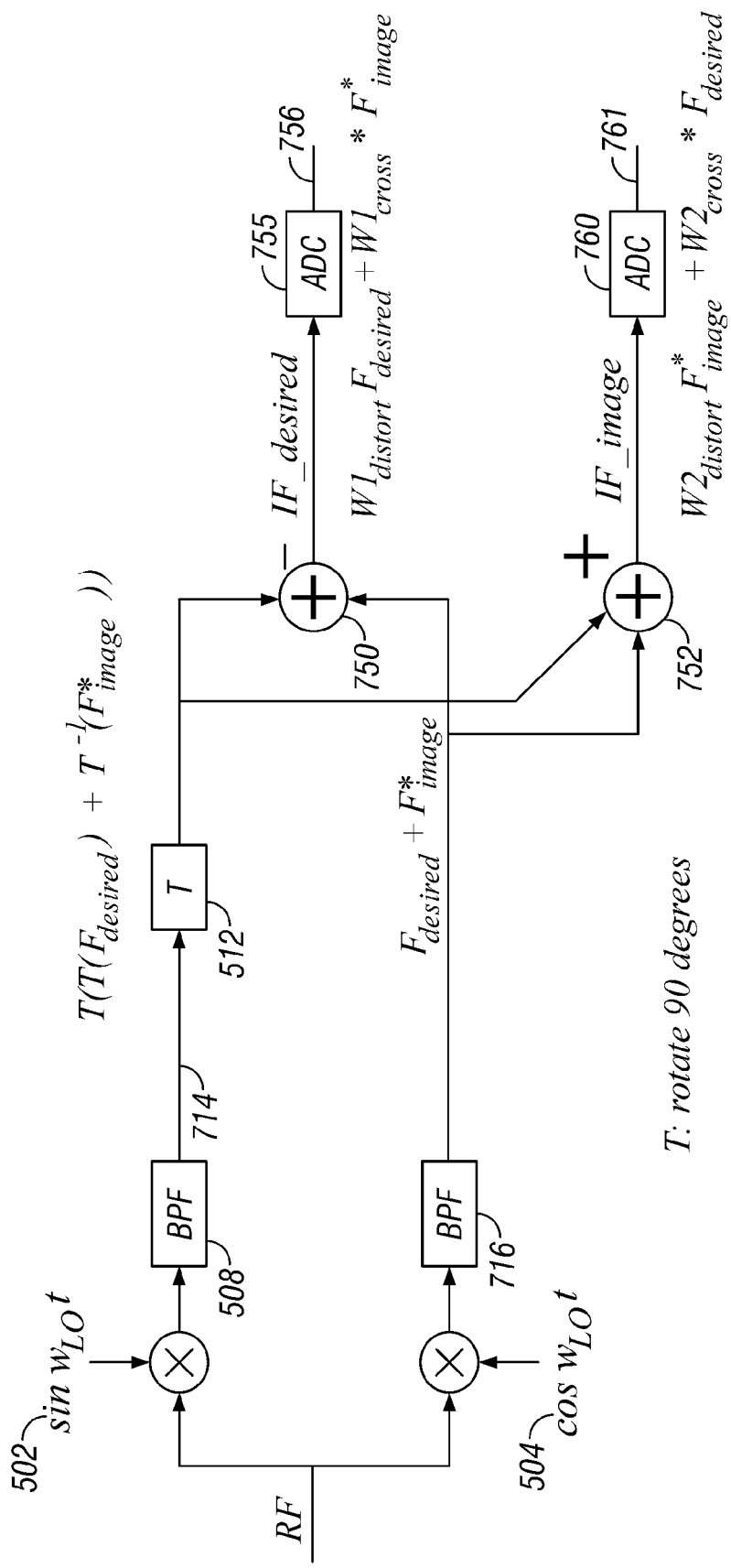
FIGS. 7A and 7B show an analog filter that operates using similar techniques to that described relative to FIGS. 6A and 6B.
Figure 7B:
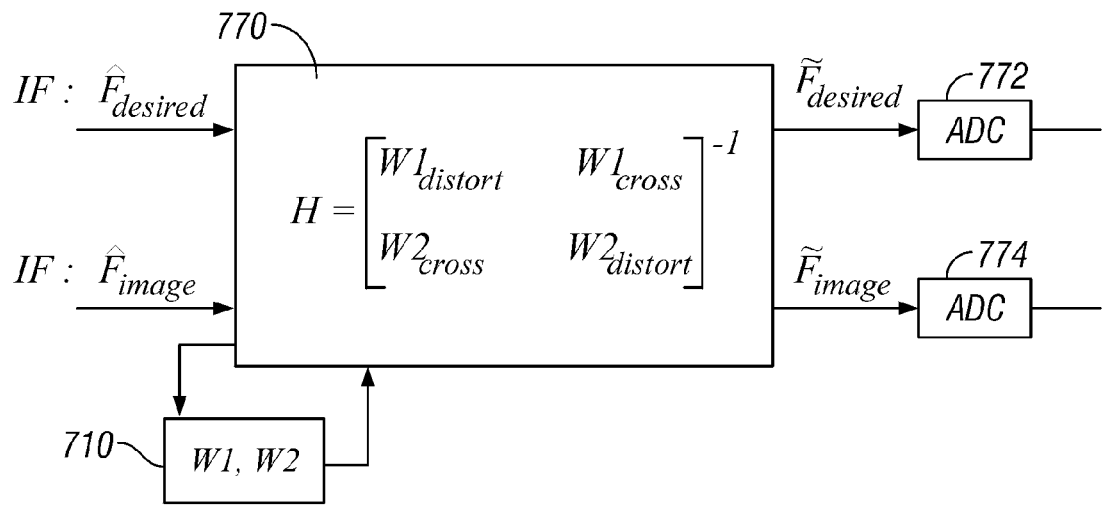

FIGS. 6A and 6B show how this filtering can be done in a digital filter. FIGS. 7A and 7B show an alternative configuration in which the filtering is done in the analog domain. In FIG. 7A, the bandpass filter 508 feeds its output signal 714 directly to the clockwise rotator device 512. Similarly, in the quadrature branch, the output of the band pass filter 716 remains in the analog domain. Therefore, in FIG. 7A, the adder 750 is actually an analog adder, which simply sums the voltages at the nodes, while the subtracter 752 is an analog subtracter that subtracts the voltages applied to the nodes. The output of the adder, representing $IF_{desired}$, is coupled to an A/D converter 755 which produces a digital output signal 756. Analogously, the $IF_{image}$ signal is coupled to an A/D converter 760 that produces an output signal 761. In figure 7B, the filter 770 is actually an analog filter that operates based on analog signals, and both $F_{desired}$ and $F_{image}$ are output to respective A/D converters 772, 774.

The techniques described above have described one form of compensation, but it should be understood that the same techniques can be used to carry out other compensation, using even more compensation. For example, a recursive solution of equations 3 and 4 can be carried out.

The filter described above can be embodied in a number of different ways. For example, it may be preferred to embody this filter as part of an integrated circuit on a single piece of silicon, where one or many circuits may be formed on a single silicon substrate, and other digital components used for the communication may also be formed on the substrate. In addition, however, this may be embodied as discrete components, e.g. defined using hardware definition language, or by a suitably programmed digital signal processor, or in software executed by a general purpose processor. The processor may filter the signal according to the filter transfer function shown in FIG. 7. The processor may also be configured to simulate the results of the filter, e.g., as part of a simulation program such as Matlab™.

In addition, other modifications are possible. For example, while the above describes one way of using this system as part of an image rejection mixer, it should be understood that this system can analogously be used for other kinds of noise rejection. Moreover, while this describes the compensation being done in the digital domain, it should be understood that this could also be done in the analog domain.

All such modifications are intended to be encompassed within the following claims.

What is claimed is:

1. A mixer, comprising:
   a first mixing part, which mixes an input RF signal with a first local oscillator component to produce a first mixed component;
   a second mixing part, which mixes the input RF signal with a second local oscillator component, which second local oscillator component is orthogonal to the first local oscillator component, to produce a second mixed component;
   a phase rotating part, which changes a phase of one of the first mixed component and the second mixed component, relative to the other; and
   sum and difference parts, which combine the first and second mixed components, one of which is rotated in phase, to obtain a first signal that is primarily based on a desired signal, and a second signal that is primarily based on an image signal.

2. The mixer as in claim 1, further comprising a filter, which uses the second signal to compensate for distortion in the first signal.

3. The mixer as in claim 2, wherein the filter comprises a digital filter.

4. A mixer, comprising:
   a first mixing means, which mixes an input RF signal with a first local oscillator component to produce a first mixed component;
   a second mixing means, which mixes the input RF signal with a second local oscillator component, which second local oscillator component is orthogonal to the first local oscillator component, to produce a second mixed component;
   a phase rotating means, which changes a phase of one of the first mixed component and the second mixed component, relative to the other; and
   sum and difference means, which combine the first and second mixed components, one of which is rotated in phase, to obtain a first signal that is primarily based on a desired signal, and a second signal that is primarily based on an image signal.

5. The mixer as in claim 4, further comprising a filter means, which uses the second signal to compensate for distortion in the first signal.

6. The mixer as in claim 5, wherein the filter means comprises a digital filter.

7. A method comprising:
   receiving an RF signal and producing a representation indicative thereof;
   mixing the representation with a sine signal to produce a first mixed component, and with a cosine signal to produce a second mixed component, which is in phase quadrature with the first mixed component;
   changing a phase of at least part of a signal representing one of the mixed components to provide a phase rotated component; and
   combining at least one of the first and second mixed components with the phase rotated component, to obtain a first signal that is primarily based on a desired signal, and a second signal that is primarily based on an image signal.

8. The method as in claim 7, further comprising:
filtering the first and second mixed components; and
digitizing the first and second mixed components;
wherein the signal representing one of the mixed components comprises a digital signal.

9. The method as in claim 8, wherein the combining comprises digitally combining.

10. The method as in claim 8, wherein the combining comprises combining in analog.

11. The method as in claim 8, wherein the combining produces a first signal, which is based on the desired signal and the image signal, and the second signal is based on the image signal.

12. The method as in claim 7, further comprising storing specific values related to imperfections in the mixing.

13. The method as in claim 12, further comprising determining mismatches in the mixing using an adaptive least mean squares approach, and storing the specific values in a channel characteristic storage device.

14. The method as in claim 12, further comprising determining and storing information indicative of mismatches in the mixing.

15. The method as in claim 7, wherein the mixing comprises mixing in analog.

16. The method as in claim 7, further comprising filtering using the second signal to compensate for distortion in the first signal.

17. The method as in claim 16, wherein the filtering comprises digitally filtering.

18. A system, comprising:
a receiver to receive an RF signal and produce a representation indicative thereof;
a mixer to mix the representation with a cosine signal to produce a first mixed component, and with a sine signal to produce a second mixed component, which is in phase quadrature with the first mixed component;
a phase rotator to change a phase of at least part of a signal representing one of the mixed components to provide a phase rotated component; and
an adder to combine at least one of the first and second mixed components with the phase rotated component, to obtain a first signal that is primarily based on a desired signal, and a second signal that is primarily based on an image signal.

19. The system as in claim 18, further comprising:
a first filter to filter the first mixed component;
a second filter to filter the second mixed component;
a first A/D converter to digitize the first mixed component; and
a second A/D converter to digitize the second mixed component;
wherein the phase rotator receives the signal representing one of the mixed components, in digital.

20. The system as in claim 19, wherein the adder comprises a digital adder.

21. The system as in claim 19, wherein the adder produces a first output, which is based on the desired signal and the image signal, and a second output, which is based on the image signal.

22. The system as in claim 21, further comprising a third filter that uses the second output as an estimate of the image signal, and uses the estimate to compensate for distortion in the first output.

23. The system as in claim 22, wherein the third filter comprises a digital filter.

24. The system as in claim 21, further comprising a channel characteristic storage device storing specific values related to imperfections in the mixer.

25. The system as in claim 24, wherein each specific value includes at least one value indicative of distortion in the mixer.

26. The system as in claim 24, wherein each specific value includes at least one value indicative of crosstalk in the mixer.

27. The system as in claim 24, further comprising a compensation unit, which determines mismatches in the mixer using an adaptive least mean squares approach, and stores the values in the channel characteristic storage device.

28. The system as in claim 24, further comprising a channel characterizer, which determines and stores information indicative of mismatches in the mixer in the channel characteristic storage device.

29. The system as in claim 18, wherein the mixer uses analog components.

30. An RF circuit, comprising:
first mixing means for mixing an input RF signal with a sine component to produce a first mixed component;
second mixing means for mixing the input RF signal with a cosine component to produce a second mixed component that is orthogonal to the first mixed component;
means for rotating a phase of one of the first mixed component and the second mixed component, relative to the other;
summing means for combining the first and second mixed components, one of which is rotated in phase, to obtain a first signal that is primarily based on a desired signal, and
difference means for obtaining a difference between the first and second mixed components to obtain a second signal that is primarily based on an image signal.

31. The circuit as in claim 30, wherein the first and second mixing means comprise digital mixing means.

32. The circuit as in claim 30, wherein the summing means and difference means comprise digital adders.

33. The circuit as in claim 30, wherein the summing means produces a first output, which is based on the desired signal and the image signal, and the difference means produces a second output, which is based on the image signal.

34. The circuit as in claim 33, further comprising compensation means for using the second output as an estimate of the image signal, and using the estimate to compensate for distortion in the first output.

35. The circuit as in claim 34, further comprising a channel characteristic storage means for storing specific values related to imperfections in the first and second mixing means.

36. The circuit as in claim 35, further comprising a compensation means for determining mismatches in the first and second mixing means using an adaptive least mean squares approach, and storing the specific values in the channel characteristic storage means.

37. The circuit as in claim 35, further comprising a channel characterizer for determining and storing information indicative of mismatches in the first and second mixing means in the channel characteristic storage means.

38. The circuit as in claim 30, wherein the first and second mixing means comprise analog components.

39. The circuit as in claim 30, further comprising:
a first filtering means for filtering the first mixed component;
a second filtering means for filtering the second mixed component;
a first A/D converting means for digitizing the first mixed component; and a second A/D converting means for digitizing the second mixed component;

wherein the means for rotating a phase receives one of the first mixed component and the second mixed component, in digital.

40. A method, comprising:

first mixing an input RF signal with a sine component to produce a first mixed component;

second mixing the input RF signal with a cosine component to produce a second mixed component that is orthogonal to the first mixed component;

rotating a phase of one of the first mixed component and the second mixed component, relative to the other;

combining the first and second mixed components, one of which is rotated in phase, to obtain a first signal that is primarily based on a desired signal, and obtaining a difference between the first and second mixed components to obtain a second signal that is primarily based on an image signal, wherein the first and second mixing comprise digitally mixing.

41. The method as in claim 40, wherein the combining comprises digitally combining and the obtaining comprises digitally obtaining.

42. The method as in claim 40, wherein the combining produces a first output, which is based on the desired signal and the image signal, and the obtaining produces a second output, which is based on the image signal.

43. The method as in claim 42, further comprising using the second output as an estimate of the image signal, and using the estimate to compensate for distortion in the first output.

44. The method as in claim 40, further comprising storing specific values related to imperfections in the first and second mixing.

45. The method as in claim 44, wherein the storing comprises determining mismatches in the first and second mixing using an adaptive least mean squares approach, and storing the specific values in a channel characteristic storage device.

46. The method as in claim 45, wherein the first and second mixing comprise mixing in analog.

* * * * *